United States Patent [19]

Rosler et al.

[11] 4,401,687

[45] Aug. 30, 1983

[54] PLASMA DEPOSITION OF SILICON

[75] Inventors: Richard S. Rosler, Paradise Valley; George M. Engle, Scottsdale, both of Ariz.

[73] Assignee: Advanced Semiconductor Materials America, Phoenix, Ariz.

[21] Appl. No.: 320,451

[22] Filed: Nov. 12, 1981

[51] Int. Cl.³ ............................................. B05D 5/12
[52] U.S. Cl. ........................................ 427/38; 427/39
[58] Field of Search ..................................... 427/38, 39

[56] References Cited

U.S. PATENT DOCUMENTS 4,223,048  9/1980  Engle .......................... 427/255.3 X
4,292,343  9/1981  Plaettner et al. ..................... 427/39

*Primary Examiner*—James R. Hoffman
*Attorney, Agent, or Firm*—Harry M. Weiss

[57] ABSTRACT

Method for plasma deposition of silicon from a silicon source gas. By inclusion of a halogen species in the gas flow stream, thermally induced deposition is inhibited so that plasma decomposition predominates. The silicon gas source may comprise the halogen species, which may alternatively be under separate control. The suppression of thermally induced deposition leads to improved thickness uniformity across the workpieces for significantly increased lifetime or runtime without the conductive plates shorting together.

11 Claims, No Drawings

PLASMA DEPOSITION OF SILICON

RELATED APPLICATION

The patent application "Spacer for Preventing Shorting Between Conductive Plates in RF Plasma Deposition Systems", having Ser. No. 320,453, filed on even date herewith by the co-inventors herein, relates to the subject matter of this application.

BACKGROUND OF THE INVENTION

1. Field of the Invention

This invention relates generally to a method for plasma deposition of silicon, and, more specifically, relates to a high-temperature method for plasma deposition of silicon wherein thermal deposition is largely suppressed.

2. Description of the Prior Art

In the paste, plasma deposition of silicon has been effected at high temperatures in order to control the characteristics of the deposited film. The state of the art in plasma processing is described in *Solid State Technology*, April 1978, pp 89–126. Specific methods and details of a plasma deposition system are to be found in the Engle U.S. Pat. No. 4,223,048 issued, Sept. 16, 1980. When plasma deposition is effected in a high temperature ambient, however, there is a tendency to induce thermal decomposition of the silicon source gas, whereby deposition takes place not only on the workpieces but also throughout the heated portions of the deposition system. An additional undesirable feature of the thermal decomposition is that thermal inhomogeneity engenders non-uniform deposition.

Recent requirements in the fabrication of semiconductor wafers have mandated very close thickness and compositional control over scores of workpieces in a single deposition cycle. Thus, not withstanding the developments of the past, a need continues to exist for improved control of the deposition of silicon and polysilicon. Furthermore, for plasma deposition of conducting films, a need continues to exist for a deposition method whereby thermal deposition is inhibited on the necessarily insulative portions of the deposition system.

SUMMARY OF THE INVENTION

In accordance with the broadest aspect of this invention, it is an object to provide a plasma deposition method capable of improved deposition uniformity.

It is another object of this invention to provide a deposition method for expitaxial and polycrystalline silicon in the range 600°–1200° C.

It is a further object of the present invention to provide uniform plasma deposition of polycrystalline silicon films at temperatures higher than presently employed by artisans.

It is yet another object of this invention to provide a method for plasma deposition of silicon which enables the use of the same deposition system for both the deposition of polysilicon and epitaxial silicon films.

It is an additional object of this invention to provide a method whereby single crystal epitaxial silicon may be deposited at a lower temperature and with greater uniformity.

It is still another object of the inventive method to suppress thermal decomposition of conductive films in order to avoid shorting between the adjacent electrodes which support the plasma.

In accordance with one embodiment of this invention, there is provided a method for the plasma vapor deposition of silicon at elevated temperature comprising introducing halogenated gas into said vapor for increasing the rate of plasma-induced vapor deposition relative to thermally-induced vapor deposition.

In accordance with another embodiment of this invention, there is provided a method for the plasma vapor deposition of polycrystalline silicon at elevated temperature comprising introducing chlorinated gas into said vapor for increasing the rate of plasma induced vapor deposition relative to thermally induced vapor deposition.

In accordance with yet another embodiment of this invention, there is provided a method for the plasma deposition of single crystal epitaxial silicon at elevated temperature comprising introducing halogenated gas into said vapor for increasing the rate of plasma induced vapor deposition relative to thermally induced vapor deposition.

The foregoing and other objects, features and advantages of this invention will be apparent from the following more particular description of the preferred embodiments of the invention.

U.S. Pat. No. 4,223,048 issued Sept. 16, 1980 to George M. Engle, Jr., a co-applicant for this invention, is hereby incorporated by reference. That patent discloses a system and method suitable for the deposition and etching of e.g. polysilicon and insulating films in a plasma. For example, to plasma deposit polysilicon, $SiH_4$ is introduced into a heated evacuated system containing workpieces between electrodes configured to sustain a uniform plasma therebetween. Typically, such a deposition would take place at or below about 600° C., because, as the temperature is raised thereover, it becomes increasingly difficult to maintain homogeneous deposited film thickness because deposition induced by thermal decomposition of the silicon source gas becomes significant with respect to the plasma deposition rate. Because of difficulty in obtaining extremely well-controlled temperature ambients over a multiplicity of workpieces, film thickness may vary from substrate-to-substrate and even within a substrate. Additionally, as the temperature is raised, deposition increasingly takes place on the walls of the evacuated enclosure and on the electrode structures, leading to cleaning problems and often to debris on the workpieces. For conductive film deposition, shorting may occur between adjacent plates of the reactor.

However, it is often desired to increase the deposition temperature of the film in order to control other desirable properties in the film, e.g. grain size and doping, inter alia. For example, increasing the temperature allows deposition of single crystal silicon.

In accordance with the present invention, a halogenated gaseous component is introduced into the gas stream in order to suppress the thermal deposition as compared with the plasma deposition. Such halogenated gaseous compositions may include, but are not limited to, silicon source gases containing chlorides, such as $SiH_2Cl_2$, $SiHCl_3$, or $SiCl_4$. Alternatively, HCl may be added to an unchlorinated silicon source gas such as $SiH_4$ in order to increase the energy required to obtain thermal deposition. Such an independent injection of the silicon species and the halogen species allows a broader range of controllable reactions. By this method of including the halogen species in an inlet gas stream, it has been found possible to heat the system to well over 600° C. with virtually no deposition in the absence of the plasma. Thus, transient problems associated with the initiation and cessation of the source gas stream may be obviated by applying the RF plasma only while the source gas flow is stabilized.

The method of this invention can be executed in a system such as described in the hereinbefore cited Engle patent. By way of exemplification of a preferred embodiment of the invention as presently contemplated, we describe the formation of a doped polysilicon film in an Engle system. Seventy 100 mm silicon wafers (coated with 1000 Å SiO$_2$) are loaded into the boat and inserted into the tube. After a temperature stabilization time of 35 minutes at 620° C. and appropriate purging and pulling vacuum to base pressure, reactant gases are introduced. Flows are 300 sccm SiH$_2$Cl$_2$, 100 sccm 1% PH$_3$ in Ar, and 800 sccm Ar with a reaction tube pressure of 2 torr. The RF generator is turned on at approximately 110 watts power to cause deposition to take place at a rate of about 270 Å/min. After a deposition time of 14 minutes, the average thickness of doped polycrystalline silicon is 3800 Å with a variation of less than ±5%. By use of the novel insulative interelectrode spacer means described in the cited related application, at least twenty deposition runs may be effected before it becomes necessary to dismantle the system to remove interelectrode deposits. The phosphorus dopant in the poly layer is activated with a temperature cycle of 1000° C. for 30 minutes. Four point probe measurements of the layer provided a range of 14 to 16 ohms per square over the load of wafers.

Above about 700° C., SiH$_2$Cl$_2$ partially decomposes into a brown powder. Therefore, in order to reach the higher temperatures required for single crystal silicon deposition, it is preferred to use SiHCl$_3$ or SiH$_4$+HCl as the halogenated gaseous means. In this way, the inventive method allows the uniform deposition of single-crystal epitaxial silicon at much lower temperatures (e.g. 900° C.) than present methods (e.g. 1100° C.) with only moderately reduced growth rates, whereby very sharp interfaces between adjacent conductive layers may be obtained. Moreover, the single-run capacity of the epitaxial reactor is substantially enhanced over existing systems. As hereinbefore, a multiplicity of runs is possible without cleaning the insulative interelectrode spacer means of conductive material.

While the invention has been particularly described and shown in reference to the preferred embodiments thereof, it will be understood by those skilled in the art that various changes in form and detail and omissions may be made therein without departing from the spirit and scope of the invention. For example, as an alternative gaseous medium for the halogenated gaseous means, silicon tetrachloride can also be used.

Furthermore, in carrying out a single crystal or epitaxial deposition, preferably, an inert gas such as argon or helium can be used or a diluent gas such as hydrogen can be used as a carrier gas.

What is claimed is:

1. In a method for the plasma vapor deposition of a silicon-comprising film, the steps of:
   introducing halogenated gas in sufficient amount into said vapor to increase the rate of plasma-induced vapor deposition relative to thermally induced vapor deposition; and
   maintaining said gas and said vapor at a temperature in a range of 600° C. to 1200° C.

2. In the method of claim 1 wherein said introducing step includes introducing chlorinated gas.

3. The method of claims 1 or 2 wherein said film is conductive.

4. The method of claims 1 or 2 wherein said deposited film is polycrystalline silicon.

5. In a method for the plasma vapor deposition of polycrystalline silicon, the steps of:
   introducing chlorinated gas in sufficient amount into said vapor to increase the rate of plasma-induced vapor deposition relative to thermally induced vapor deposition; and
   maintaining said vapor at a temperature in a range of 600° C. to 1200° C.

6. In a method for the plasma deposition of single-crystal epitaxial silicon at elevated temperature, the steps of:
   introducing halogenated gas in sufficient amount into said vapor to increase the rate of plasma-induced vapor deposition relative to thermally induced vapor deposition; and
   maintaining said vapor at a temperature in a range of 600° C. to 1200° C.

7. The method of claims 1, 2, 5 and 6 wherein said deposited silicon is doped to modify its electrical characteristics.

8. The method of claims 1, 2, 5 or 6 wherein said gas comprises SiH$_2$Cl$_2$.

9. The method of claim 6 wherein said gas comprises SiHCl$_3$.

10. The method of claim 6 wherein said gas comprises SiH$_4$ and HCl.

11. The method of claim 6 wherein said gas comprises silicon tetrachloride.

* * * * *